United States Patent
Lilley et al.

(10) Patent No.: US 8,050,893 B2
(45) Date of Patent: Nov. 1, 2011

(54) METHOD AND SYSTEM FOR THE DESIGN OF AN ENCLOSURE TO HOUSE INTERNAL COMPONENTS

(75) Inventors: Stephen G. Lilley, Sydney River (CA); Douglas I. Milburn, Sydney (CA); Stephen F. Manley, Nortshide East Bay (CA)

(73) Assignee: Protocase Inc., Sydney (CA)

( * ) Notice: Subject to any disclaimer, the term of this patent is extended or adjusted under 35 U.S.C. 154(b) by 801 days.

(21) Appl. No.: 11/560,949

(22) Filed: Nov. 17, 2006

(65) Prior Publication Data

US 2008/0120086 A1   May 22, 2008

(51) Int. Cl.
   *G06F 17/50*   (2006.01)
(52) U.S. Cl. .............................. 703/1; 361/796; 361/797
(58) Field of Classification Search .................... 703/10, 703/1; 379/413.02; 174/50, 67, 58, 50.67; 248/218.4; 29/385; 361/800, 797, 818, 796, 361/808; 342/4; 362/219; 700/231, 97; 600/490; 701/16, 6; 705/10; 716/11, 26, 716/27, 274; 165/54, 4; 439/607.01, 607.1; 707/1; 455/566; 463/46; 713/1; 358/498; 156/64
   See application file for complete search history.

(56) References Cited

U.S. PATENT DOCUMENTS

| | | | | |
|---|---|---|---|---|
| 4,858,087 A * | 8/1989 | Hartshorn | | 362/219 |
| 5,353,029 A * | 10/1994 | Johnston et al. | | 342/4 |
| 5,740,020 A * | 4/1998 | Palatov | | 361/796 |
| 5,788,789 A * | 8/1998 | Cooper | | 156/64 |
| 5,828,001 A * | 10/1998 | Schilham | | 174/58 |
| 6,997,747 B1 * | 2/2006 | Norte et al. | | 439/607.01 |
| 7,316,376 B1 * | 1/2008 | Engler | | 248/218.4 |
| 7,892,098 B2 * | 2/2011 | Nguyen et al. | | 463/46 |
| 2002/0059177 A1 * | 5/2002 | Hansen | | 707/1 |
| 2002/0179315 A1 * | 12/2002 | Brown | | 174/50 |
| 2003/0016519 A1 * | 1/2003 | Bachman | | 361/818 |
| 2003/0084277 A1 * | 5/2003 | Przywara et al. | | 713/1 |
| 2003/0167631 A1 * | 9/2003 | Hallenbeck | | 29/835 |
| 2004/0248619 A1 * | 12/2004 | Graiger et al. | | 455/566 |
| 2005/0203809 A1 * | 9/2005 | Stone et al. | | 705/27 |
| 2005/0263314 A1 * | 12/2005 | Payne et al. | | 174/67 |
| 2006/0001920 A1 * | 1/2006 | Moreno et al. | | 358/498 |
| 2006/0032609 A1 * | 2/2006 | Fernandez et al. | | 165/54 |
| 2006/0067522 A1 * | 3/2006 | Paulsen | | 379/413.02 |
| 2006/0100934 A1 * | 5/2006 | Burr et al. | | 705/26 |
| 2006/0155196 A1 * | 7/2006 | Ramsey | | 600/490 |
| 2006/0206246 A1 * | 9/2006 | Walker | | 701/16 |
| 2006/0262512 A1 * | 11/2006 | Klein et al. | | 361/800 |
| 2006/0268533 A1 * | 11/2006 | Miller et al. | | 361/797 |

(Continued)

OTHER PUBLICATIONS

"Front Panel Service for North America", Front Panel Designer, Front Panel, Express, LLC, Seattle WA, 1 page, www.frontpanelexpress.com.

(Continued)

*Primary Examiner* — Kandasamy Thangavelu
(74) *Attorney, Agent, or Firm* — Marks & Clerk

(57) ABSTRACT

Disclosed are a method, a computer-based system and a computer-readable medium having computer-readable code embodied therein for creating the specifications for the fabrication of a fully customized enclosure housing internal components. First a suitable three dimensional template representing a basic form of the enclosure is chosen from a plurality of predetermined three dimensional templates and sized. Each face of the enclosure is selected and customized by selecting specific design features from a range of predetermined design options as necessary until a complete set of specifications for the enclosure is obtained.

11 Claims, 15 Drawing Sheets

U.S. PATENT DOCUMENTS

2006/0293784 A1* 12/2006 Braunstein .................... 700/231

OTHER PUBLICATIONS

"EMachineShop.com", Order custom parts online, Midland Park, NJ 07432, 2 pages, www.emachineshop.com.

"CAD X11", GreyTech Software, Inc., Wheaton, Il, 3 pages, www.graytechsoftware.com.

"Free Mechanical Engineering CAD Software", 2D/3D CAD Systems et al., 10 pages, www.freebyte.com.

"CAD & Linux: The LUnix Linux CAD Links", Tech-EDV, 9 pages, www.tech-edv.co.at.

* cited by examiner

Front face view mbox# METHOD AND SYSTEM FOR THE DESIGN OF AN ENCLOSURE TO HOUSE INTERNAL COMPONENTS

FIELD OF THE INVENTION

The present invention relates to the fabrication of enclosures such as metal enclosures for housing internal components, such as printed circuit boards.

BACKGROUND OF THE INVENTION

Enclosures are used in general to house all types of internal components. For example, enclosures are required to house printed circuit boards (PCBs). Most electronic engineers are knowledgeable when it comes to designing PCBs. However, many times, the mechanical challenge is that the enclosure must be custom designed in order to accommodate the PCB, or other electronic components. This process can be difficult and time consuming. Many electronic engineers do not have the tools required to efficiently design enclosures to accommodate their electronic designs.

Software to aid in the design of various mechanical devices is available. One such program is Front Panel Designer (FPD), owned by Front Panel Express LLC. FPD is a template-based computer-aided design (CAD) tool that incorporates features such as price estimation, online ordering and material selection. Two 2D templates are offered: rectangular and elliptical. This software can be used to design only front panels of enclosures however. The program is not a proper 3D CAD tool that can be used to design full enclosures.

Another program is eMachineShop (eMS) owned by eMachineShop.com. eMS is a custom design tool aimed at permitting users to custom design various mechanical parts, such as parts for bikes, cars, airplanes, etc. The user begins by either drawing the design right in the program itself or importing an existing drawing from a CAD program. This program is therefore difficult to use. Further, the program does not seem to provide any pre-defined system cutouts and holes that can be used during the design process.

Additional programs available include software from GrayTech Software, Inc., various Windows programs available from Freebyte, and various Linux programs. Again however these require the user in effect to build up the design from scratch.

SUMMARY OF THE INVENTION

A method and system for the design of a custom enclosure to house internal components including electronic components such as a printed circuit board (PCB) is disclosed. The method and system in accordance with teachings of this invention permit a user to navigate through a series of intuitive user interfaces to produce a suitable enclosure design. The method and system in accordance with this teaching is simple to use and learn, and allows clients to design their own custom enclosures in a short time.

The present method and system uses mass customization: the use of flexible computer-aided manufacturing systems to produce custom output. Such a system combines the low unit costs of mass production processes with the flexibility of individual customization.

An advantage of a program and system in accordance with the teachings of this invention is that an enclosure can be fabricated with a minimum amount of work by using a pre-chosen base template design.

Thus, according to one aspect, the invention provides a method of creating the specifications for the fabrication of a fully customized enclosure housing internal components, comprising: a) selecting a suitable three dimensional template representing a basic form of the enclosure from a plurality of predetermined three dimensional templates; b) sizing the template based on a user's requirements; c) selecting a face of the enclosure; d) customizing the selected face by selecting specific design features from a range of predetermined design options; and e) repeating steps (c) and (d) for each face of the enclosure as necessary until a complete set of specifications for the enclosure is obtained.

In another aspect, the invention provides a computer-based system for creating the specifications for the fabrication of a fully customized enclosure housing internal components, comprising: a) means for selecting a suitable three dimensional template representing a basic form of the enclosure from a plurality of predetermined three dimensional templates; b) means for sizing the template based on a user's requirements; c) means for selecting a face of the enclosure; and d) means for customizing the selected face by selecting specific design features from a range of predetermined design options; wherein for each face of the enclosure can be selected and customized as necessary until a complete set of specifications for the enclosure is obtained.

In another aspect, the invention provides a computer-readable medium having computer-readable code embodied therein for creating the specifications for the fabrication of a fully customized enclosure housing internal components, the code permitting a user to perform the steps of: a) selecting a suitable three dimensional template representing a basic form of the enclosure from a plurality of predetermined three dimensional templates; b) sizing the template based on a user's requirements; c) selecting a face of the enclosure; d) customizing the selected face by selecting specific design features from a range of predetermined design options; and e) repeating steps (c) and (d) for each face of the enclosure as necessary until a complete set of specifications for the enclosure is obtained.

The design process itself is driven by the software of the present invention. The software is a downloadable enclosure design application that is user friendly, simple to use and intuitive. In general, the design process entails a client selecting a suitable 3D template to start from. The user selects a face, and can customize the face with various design options, such as cutouts, standoffs, and labeling. Once the design is complete, the user can request a price quote which can be either generated by formulas embedded in the software, or via a web query to the company's server which is transparent to the user but allows for constantly updated pricing formulas, or by contacting a company representative to discuss the design. The client receives a quote and can place an order and typically receives their order in a couple of weeks.

Template-based design is the process of using a "template" as the starting point for designing an enclosure. Templates allow clients the ability to start with a base 'shell' enclosure design and then customize to meet their specific needs. Templates save clients hours of design time, either their own valuable time or the time and cost associated with having one of our tech support personnel providing design services for them. Instantaneous pricing can be obtained. A 3D template permits a user to design and view an entire enclosure.

Further, since all of the design features are predefined right within the program itself (such as cutouts and fasteners), customization of the enclosure is relatively easily accomplished.

As a further optional feature, the program offers the ability apply silk-screening including letters and images.

It will be understood that the teachings in accordance with this invention can be used in a variety of applications. Enclosures designed using the teachings herein can be used to house various internal components, including mechanical or electronic components. Reference will be made to the example of an enclosure used to house a printed circuit board. A separate example is used to describe the labeling process.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein.

This invention will now be described in detail with respect to certain specific representative embodiments thereof, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE DISCLOSED EMBODIMENTS

Figure 1:
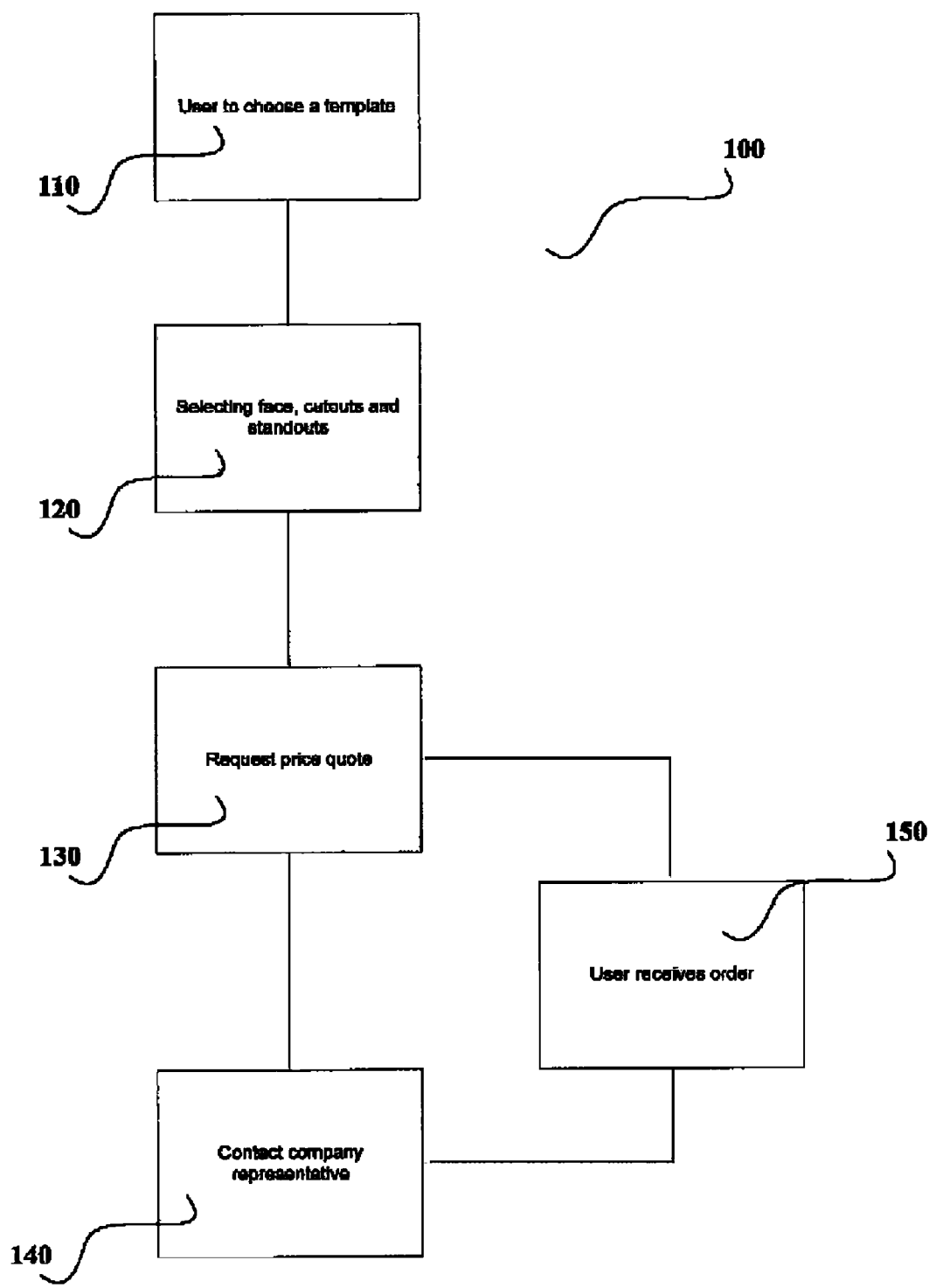
FIG. 1 illustrates a flowchart of a high level overview of the method in accordance with the teachings of this invention.

Referring to FIG. 1, there is seen a flowchart of a high level overview of the method 100 in accordance with the teachings of this invention. The scope of this invention entails the design process of customizing an enclosure for internal components, for example, a printed circuit board (PCB). It is assumed that general knowledge of enclosure design is known, such as metal selection, bend radii requirements, welding and finishing.

As a first step 110 in the overall method in accordance with the teachings of this invention, the client or user determines the appropriate route to take in designing the enclosure. The user can choose between a design template provided by the software in accordance with the teachings of this invention and a CAD template as detailed below.

In general, the design process 120 entails selecting a face, cutouts and standoffs. Once the design is complete (the process of which is detailed below), the user can request a price quote in step 130 and/or contact a company representative to discuss the design in step 140. The client receives a quote and can place an order and typically receives their order in a couple of weeks as step 150.

The design process itself is driven by the software of the present invention. The software is a downloadable enclosure design application that is user friendly, simple to use and intuitive.

As mentioned above, first a 3D template is preferably chosen. Template-based design is the process of using a template as the starting point for designing an enclosure. Templates allow users the ability to start with a base 'shell' enclosure design and then customize to meet their specific needs. Templates save clients hours of design time, either their own valuable time or the time and cost associated with having one of our tech support personnel providing design services for them.

The present application provides two types of template-based design services: CAD templates and templates within the software itself. CAD templates are useful for clients that have their own mechanical CAD software/application, such as Solidworks or AutoCad, while the templates within the software itself are for clients that have no mechanical CAD capability or simply want to take advantage of a template that is not a more complex CAD program.

There are a number of 3D enclosure design templates available. For example, a user can select a rack mount enclosure, a U-shaped enclosure, a mini-ITX enclosure, or a mechanical mounting fixture.

The enclosure shape is chosen based on the size and shape of the PCB to be enclosed. For example only, a PCB with connectors protruding on opposite sides the most effective solution would be the two piece L-shape enclosure. The selection of the appropriate shape is within the purview of a person ordinarily skilled in the art.

Figure 2:
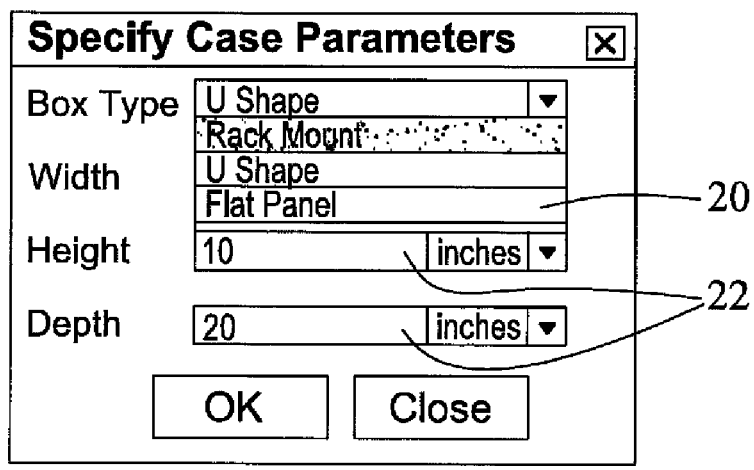
FIG. 2 illustrates a drop down box that can be used for the selection of a template along with the three major user-defined outside dimensions of the enclosure (height, width, depth) in accordance with the method of FIG. 1.

Preferably, the template choices are provided in a convenient drop down box 20 on the toolbar of the user's screen as seen in FIG. 2. The size/dimensions of the enclosure are then entered in the input boxes 22.

Figure 3:
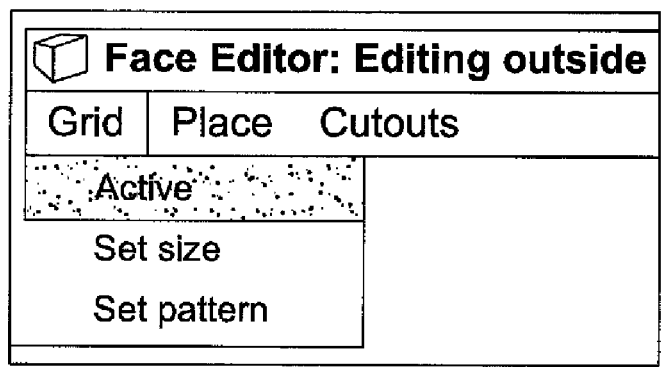
FIG. 3 illustrates one possible way a grid for the faceplate chosen from the menu in FIG. 2 can be activated.
Figure 3A:
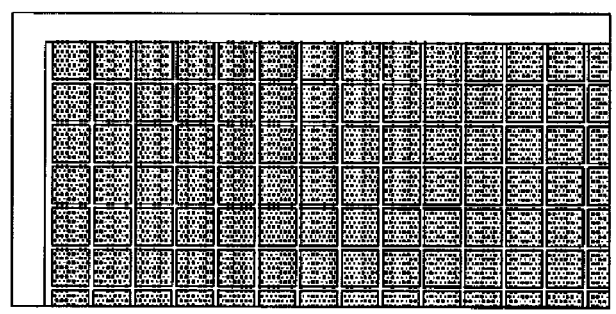
FIG. 3A illustrates one example of a line grid that can be used during the method of FIG. 1.

The design process itself starts by selecting a face of the enclosure. Preferably, this opens a child window, referred to as the Face Editor which displays a 2D image of the selected face. The Face Editor permits design of cutouts: like circles and rectangles; standard ports: like DB-9, DB-15; studs, nuts and standoffs; and custom cutouts as discussed below. Preferably, the Face Editor allows for the use of a grid display on the face. The grid can be either lines or dots, and the size of the grid can be customized. Preferably this is activated by using the "Grid" menu item on the toolbar of the program, as seen in FIG. 3. For example, a typical line grid pattern is seen in FIG. 3A.

Figure 4:
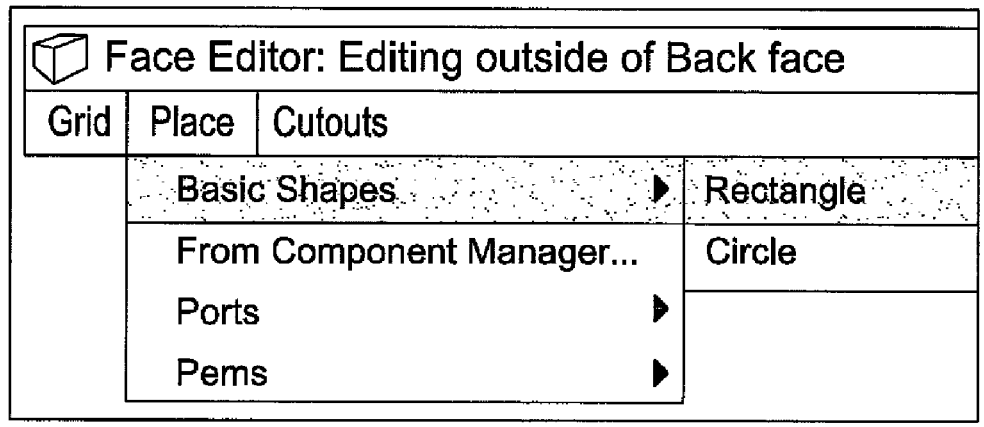
FIG. 4 illustrates one way a user can select a cutout shape for placement on the enclosure.
Figure 5:
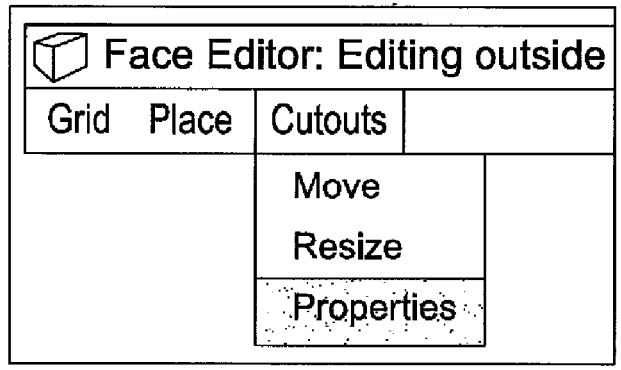
FIG. 5 illustrates one way the properties of an object added to an enclosure can be viewed.
Figure 6:
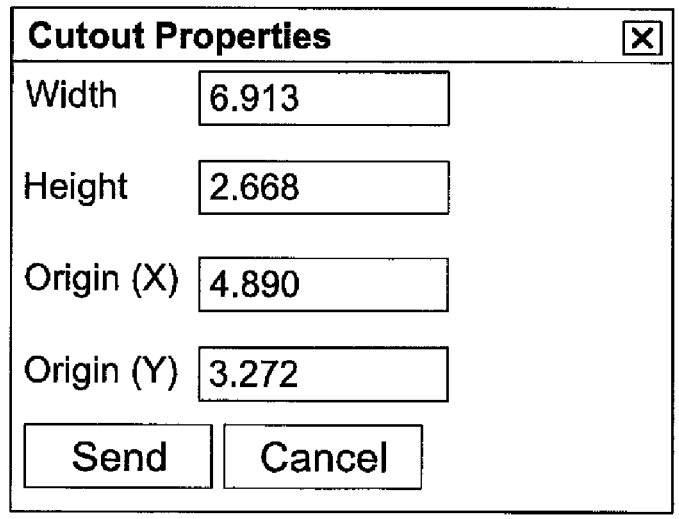
FIG. 6 illustrates a properties box available from the selection of FIG. 5.

Each face can then be customized, with appropriate shapes being selected and positioned and sized appropriately, as seen in FIG. 4. Basic cutout shapes, ports and self-clinching fasteners can be added as desired. Preferably, this is accomplished using menus on the toolbar. For example, if a rectangular cutout is desired, the user can choose Place→Basic Shapes→Rectangle from the toolbar. The rectangle can be positioned and sized using a drag and drop procedure with the mouse. The properties of an object, such as the rectangular cutout in the above example, can be viewed and amended as necessary. As seen in FIG. 5, to view the properties of the rectangular cutout, the user selects Cutouts→Properties on the toolbar and the rectangular cutout is selected with the mouse. This results in the pop up of a properties box as seen in FIG. 6. With this properties box, the size of the rectangular cutout can be changed by the Width and Height properties and the location of the cutout can be changed by Origin (X) and Origin (Y) properties.

Cutouts can be customized to mount connectors, displays, switches, etc. Cutouts can also provide a company logo or name cut out in the enclosure. Ventilation cutouts of various shapes are also possible, beyond conventional straight line ventilation cutouts.

Self-clinching fasteners are any threaded mechanical hardware (nuts, studs, or standoffs) pressed into metal enclosures for the purpose of mounting electronic fixtures such as PCBs, hard drives, power supplies, panel connectors, transformers, etc. Self-clinching fasteners are the industry standard for mounting electronic components in metal enclosures. Commonly referred to as PEM's, a trademark of Penn Engineering & Manufacturing Corp, self-clinching fasteners come in a wide variety of styles and sizes, thus facilitating the mounting of a wide range of electronic components.

Nuts can be used to accept bolts, standoffs can be inserted for mounting circuit boards and studs can be used for mounting connectors. One skilled in the art will understand how various cutouts, fasteners, etc, are used and needed for a particular situation.

Each face of the enclosure is designed in a like fashion.

Figure 32:
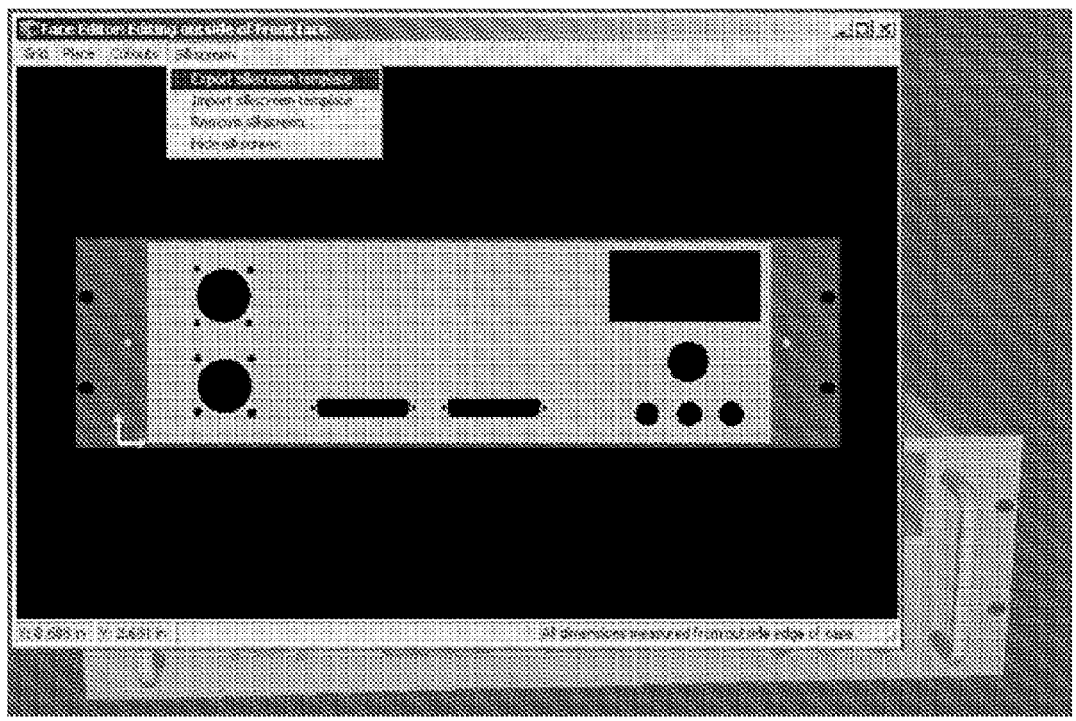
FIG. 32 illustrates a separate example of a face to be exported to allow for incorporation of labeling via silk-screening.
Figure 33:
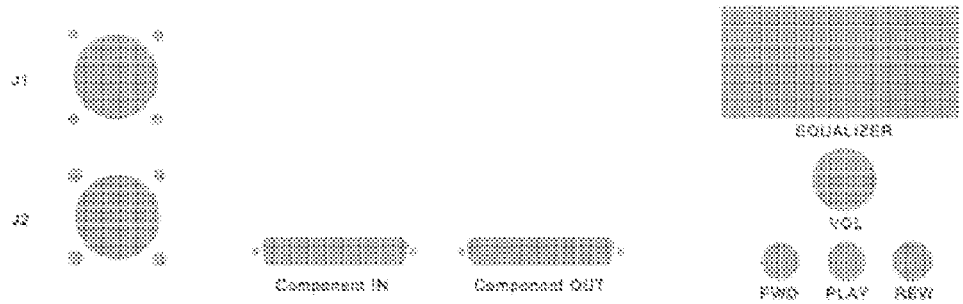
FIG. 33 illustrates the resulting face, complete with labeling requirements, to be imported.
Figure 34:
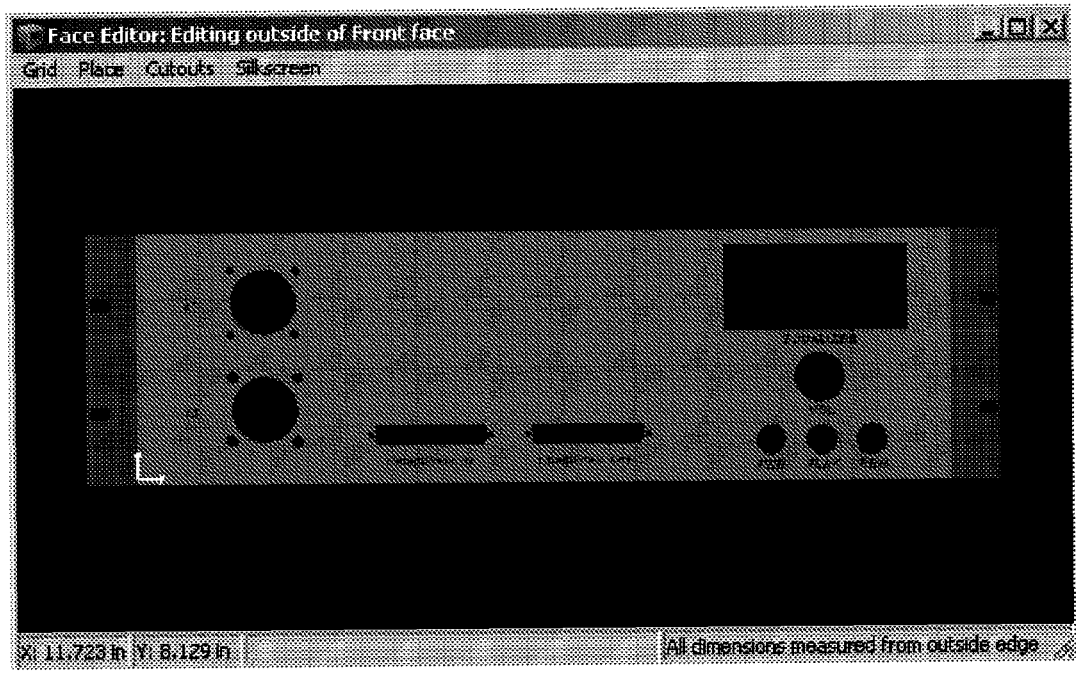
FIG. 34 illustrates the imported face in the face editor complete with silk-screen requirement.
Figure 35:
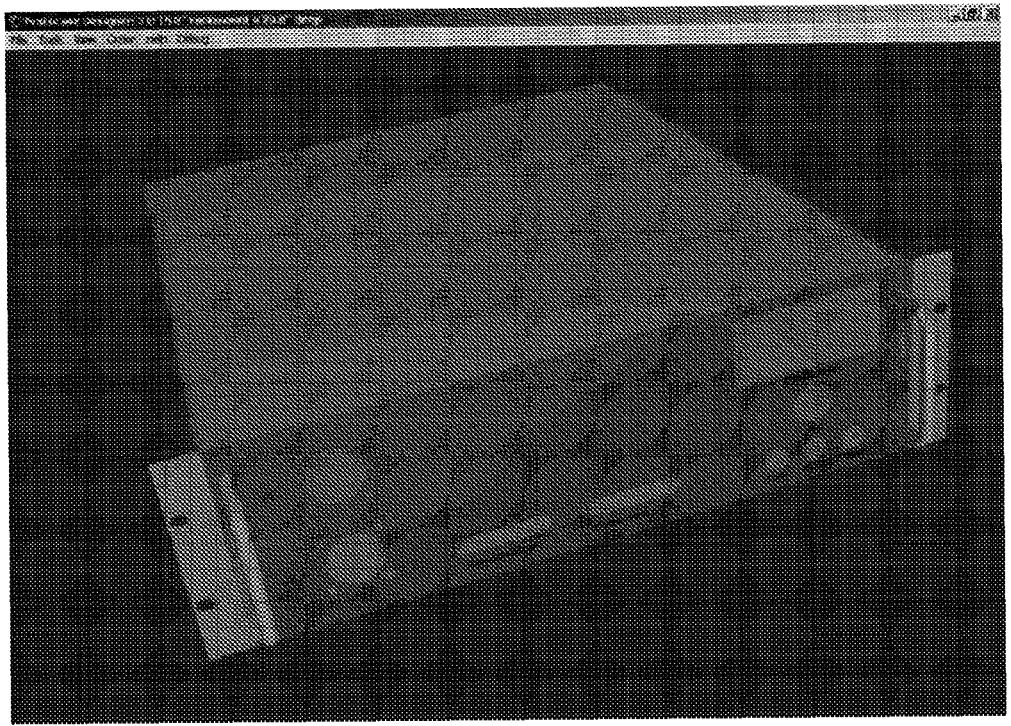
FIG. 35 illustrates the final 3D enclosure compete with silk-screen on the front panel.

As a final step, silk-screening can be performed to add a graphic, logo, or text to the final enclosure. Silk-screening can be applied by first exporting a face for editing purposes, adding graphics, logo's, or text as required then re-importing the resulting face, complete with the desired silk-screen image. FIG. 32 illustrates the export face function which can be performed by selecting Silkscreen→Export silkscreen template on the toolbar. FIG. 34 depicts the re-imported face complete with silk-screen and FIG. 35 depicts the resulting 3D representation of the enclosure.

Figure 7:
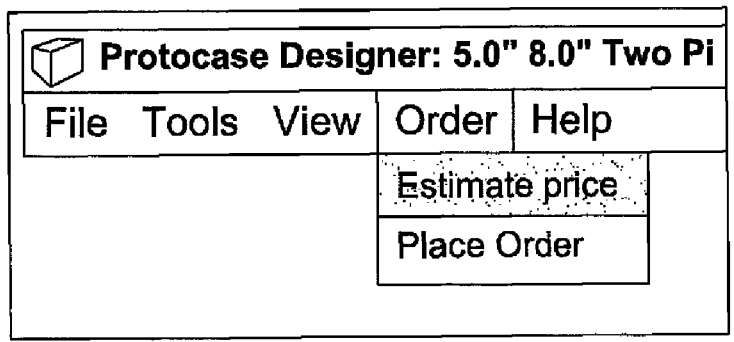
FIG. 7 illustrates one possible way a user can request a price estimation for a completed enclosure.
Figure 8:
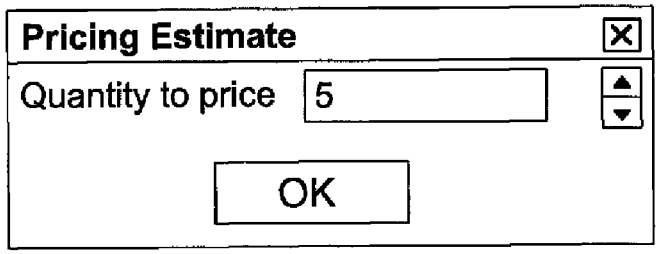
FIG. 8 illustrated a pop up window wherein the user can enter a quantity of enclosures to order.
Figure 9:
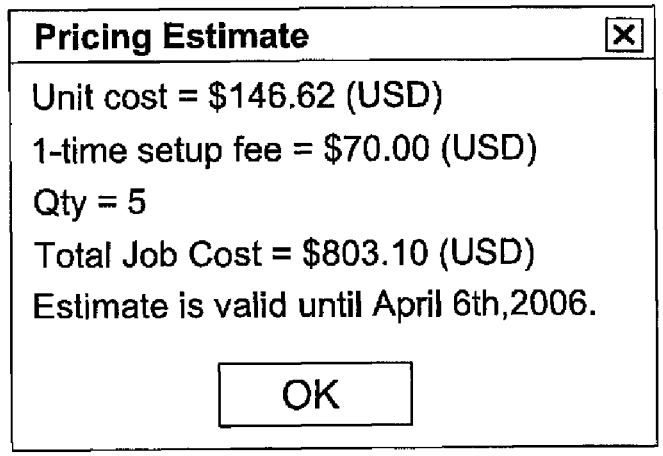
FIG. 9 illustrates an example price estimation window resulting from the steps of FIGS. 7 and 8.

When the design of the enclosure is complete, the estimated price can be obtained by selecting Order→Estimate Price on the toolbar, as seen in FIG. 7. The user is then prompted to enter a quantity of enclosures to order, seen in FIG. 8 to be 5. Once the user clicks the OK button, a small report with price estimation will pop up, an example being seen in FIG. 9. The price quote can be either generated by formulas embedded in the software, or via a web query to the company's server which is transparent to the user but allows for constantly updated pricing formulas. The web query comes from the software and allows clients to get an instant quote based on them inputting the required parametric values. These are: Enclosure style (u-shape, rack mount, etc); Outside dimensions (height, width, depth); Steel type; Steel thickness; Number of cutouts; Number of self-clinching fasteners (standoffs, nuts, studs); Required finish; and Quantity. The price is then generated from within an engine that resides within the software.

Alternatively, a price quote can be obtained by contacting a company representative to discuss the design.

Figure 10:
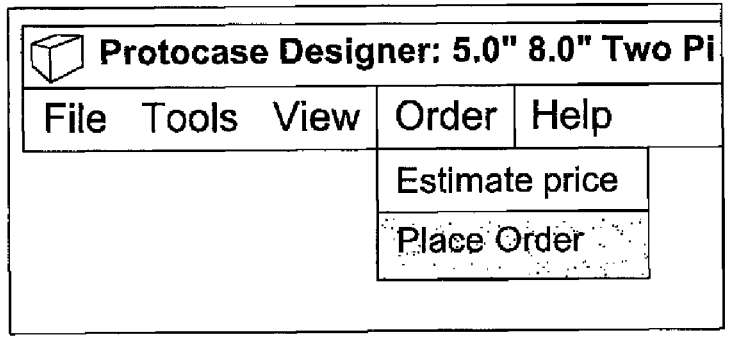
FIG. 10 illustrates an order placement window.
Figures 11, 12:
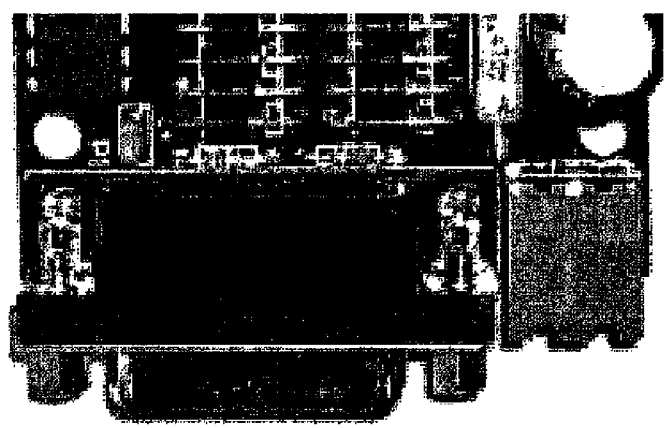
FIG. 11 illustrates a client information window wherein the user will submit the required information for order processing.
FIGS. 12, 13, 14, 15 and 16 illustrate various views of a JR Kerr's stepper motor controller for which an example enclosure is designed to show how a method in accordance with the teachings of this invention can be used.
Figure 12A:
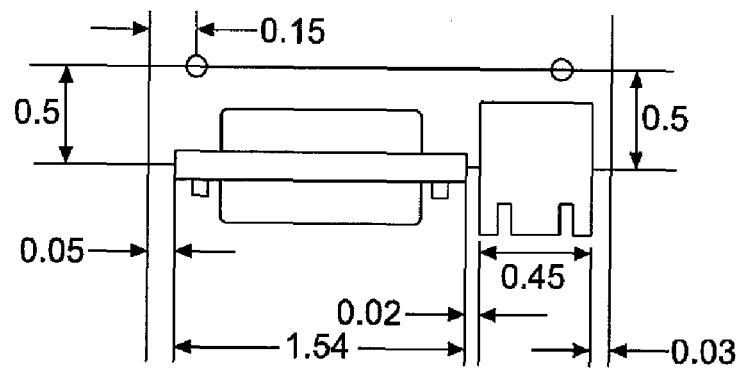
FIGS. 12A, 14A, 15A and 16A are schematic drawings of the controller seen in FIGS. 12, 14, 15 and 16 respectively.
Figure 13:
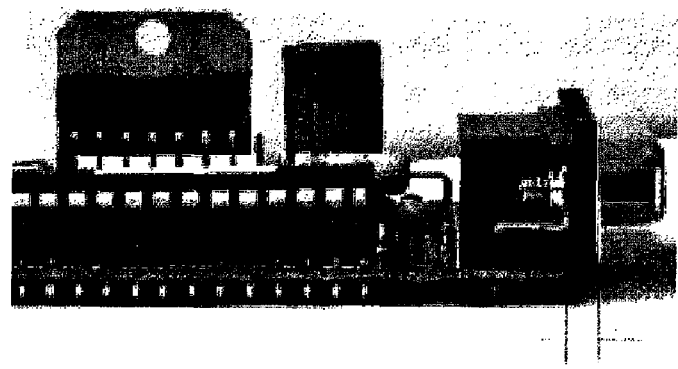

If everything is satisfactory to the user, the user can place an order by selecting Order→Place Order, as seen in FIG. 10. A client information box, seen in FIG. 11, will pop-up, wherein the user will submit the required information for order processing.

Enclosures designed using the teachings herein can be used to house various internal components, including electronic components. Teachings of the invention will now be detailed using an example project. The example revolves around an Original Equipment Manufacturer (OEM) device. The example uses JR Kerr's stepper motor controller (PIC-STEP Motion Control Board) seen in FIGS. 12 to 16 (schematically in FIGS. 12A to 16A). The mechanical challenge is to design and source a suitable enclosure for the application.

Firstly, the PCB must be optimized. As mentioned above, one skilled in the art will understand how the PCB is optimized, including design of board connectors and mounting holes.

Once the PCB has been designed, the enclosure can be designed. In this example, the requirements are to mount a single JR Kerr module in small metal enclosure, containing a single cutout for one DB-15 serial connector and one cutout to allow the connection of DC + and − power leads to screw terminal connectors. Although this is generally a very simple design in terms of requirements, much more complicated designs can be dealt with in an identical fashion using the method and system in accordance with the teachings of this invention.

A suitable template is chosen from the predetermined available templates provided by the software in accordance with the teachings of this invention. In this case, a clam shell (U-shape) enclosure is preferred for this application. A u-shape enclosure (also known as clam shell) is made of combining two u-shaped sheet metal sections. These give optimum flexibility in terms of accessibility and ease of use.

Besides the two cutouts and ventilation described above, four mounting studs are required to mount the pc board to the enclosure. The present method and system offers a host of self-clinching fasteners to be used in mounting the PCB to the enclosure. In this case example four #6-32×¼" long standoffs will be used.

Figure 14:
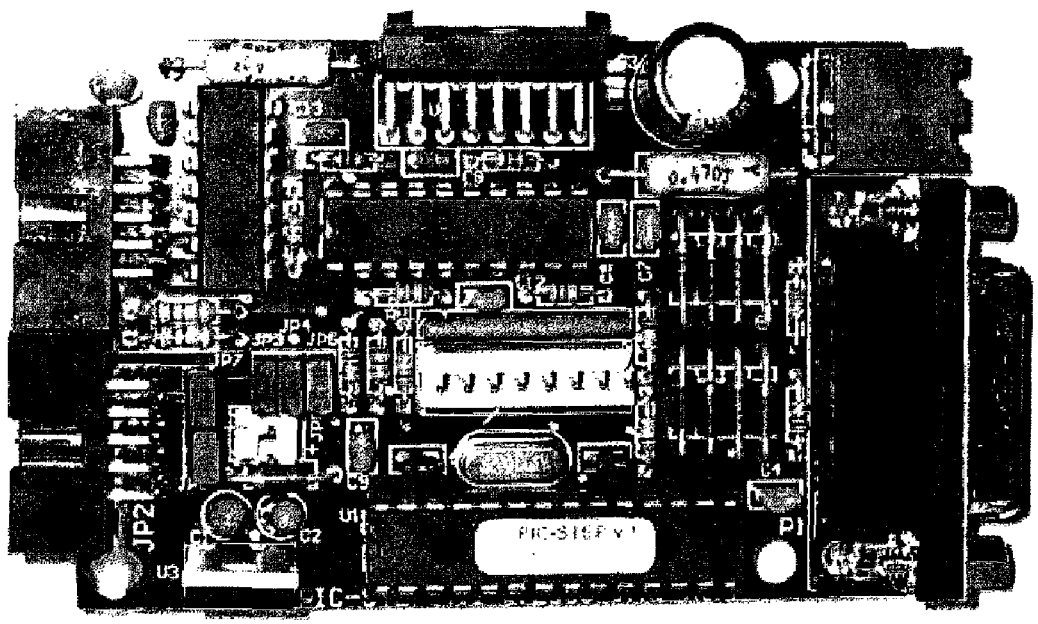
Figure 14A:
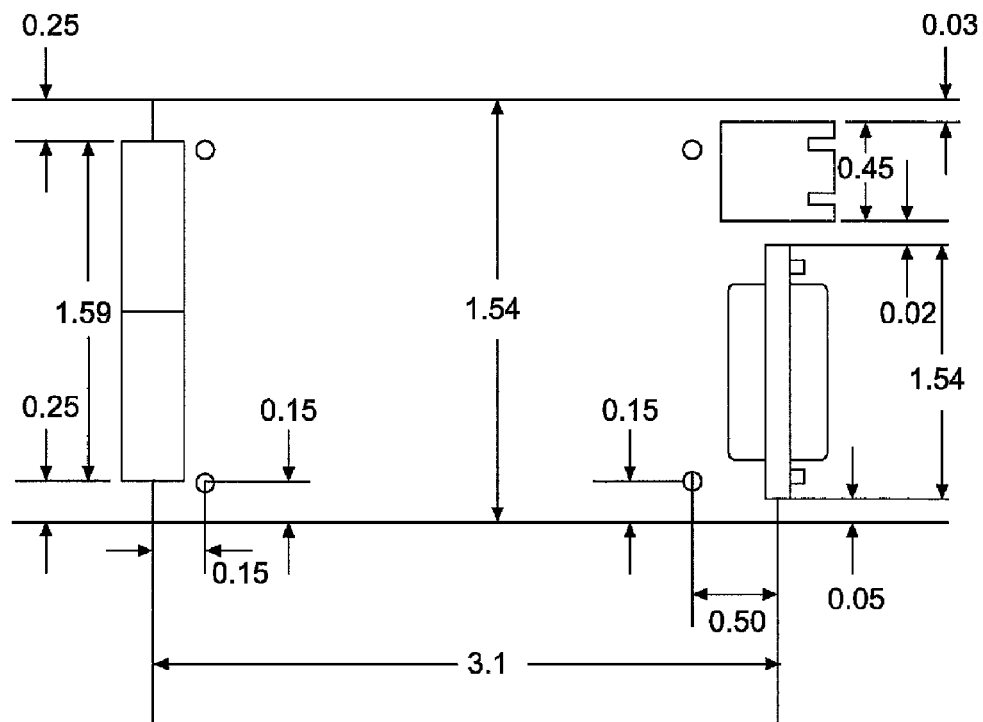
Figure 15:
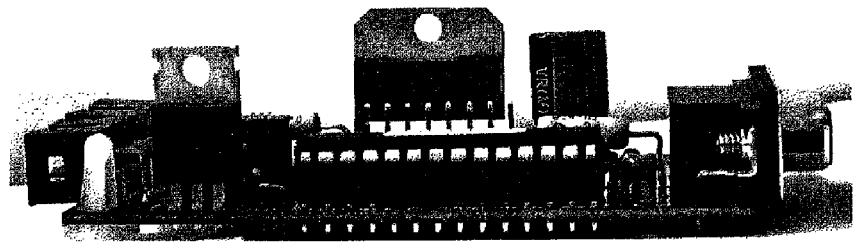
Figure 15A:
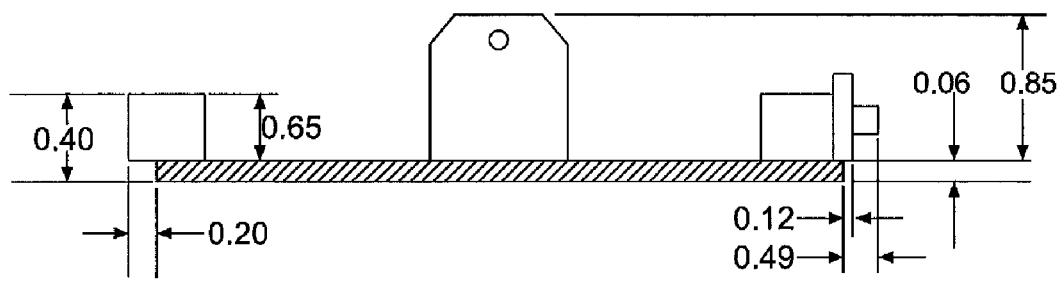

The first step in the method is to collect all relevant measurements of the PCB. FIGS. 14A, 15A, and 16A illustrate schematically the views of FIGS. 14, 15 and 16, respectively with their measurements.

Determine the Height

The material which is mounted on the PCB determines the height of the PCB. Referring to FIGS. 15 and 15A, the capacitor 10, seen in the middle, has the highest height (0.85") among all the materials, so this is taken as the height of the PCB. Some height clearance must also be added, such that the PCB does not touch the inside part of the top face of the enclosure. In this example, a height clearance of 0.15" is added as well as the material thickness.

Thus the total height would be:

The thickness of PCB+the height of the capacitor+the clearance height.

Height=0.06"+0.85"+0.15"=1.06"

Location of DB and the Connector Cutout

Figure 16:
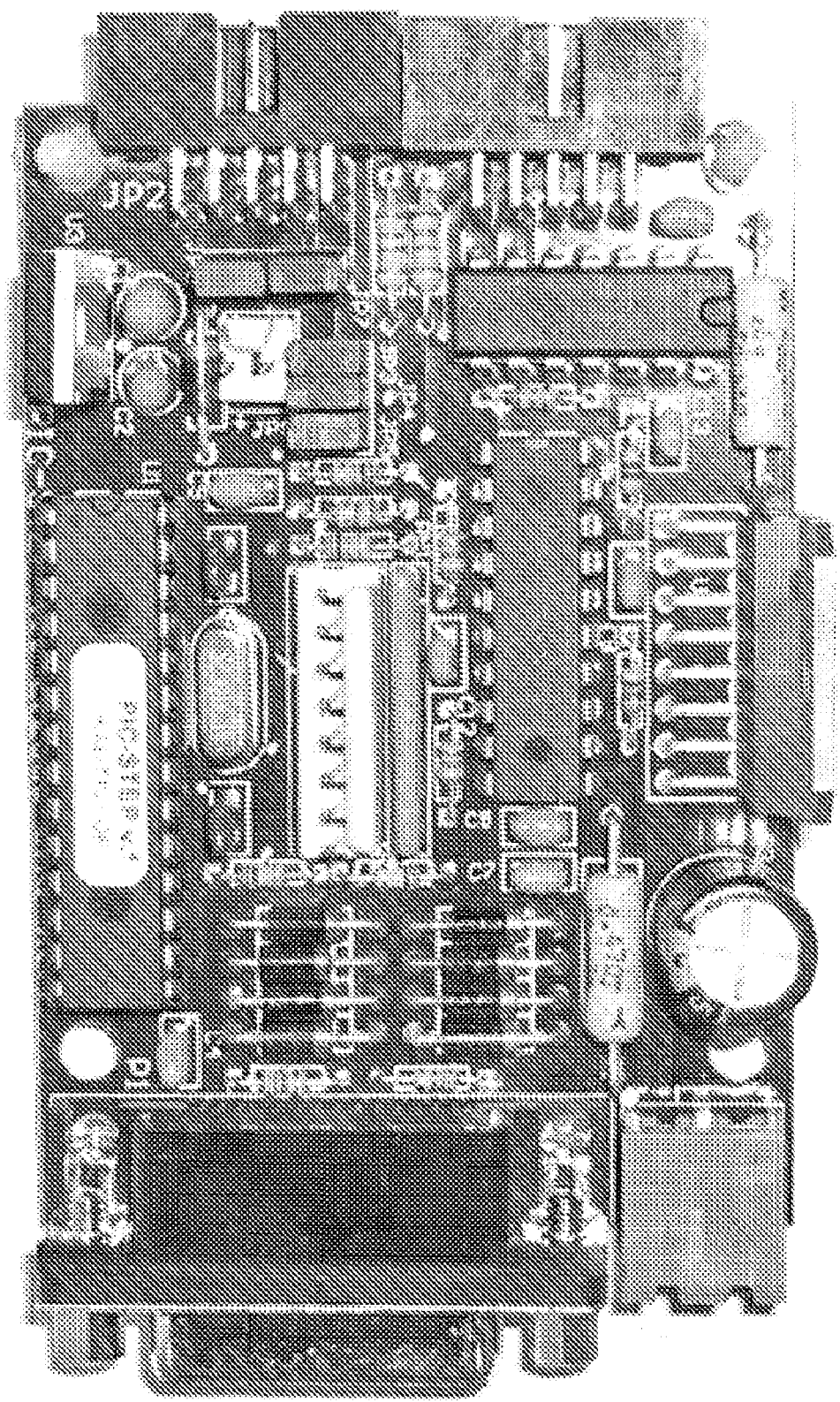
Figure 16A:
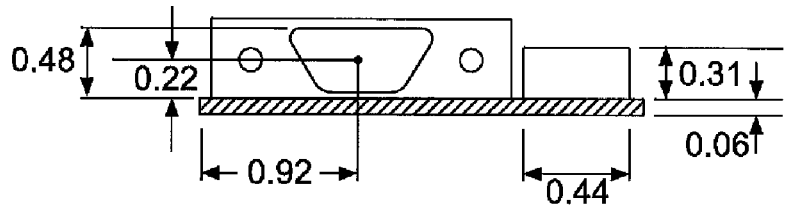

Now the location of the DB cutout is determined, referring to the bottom part of FIGS. 16 and 16A. The location of the DB cutout and the connector is located. FIG. 16A shows the measurement for the DB and the connector.

Exclusion Zone

Figure 17:
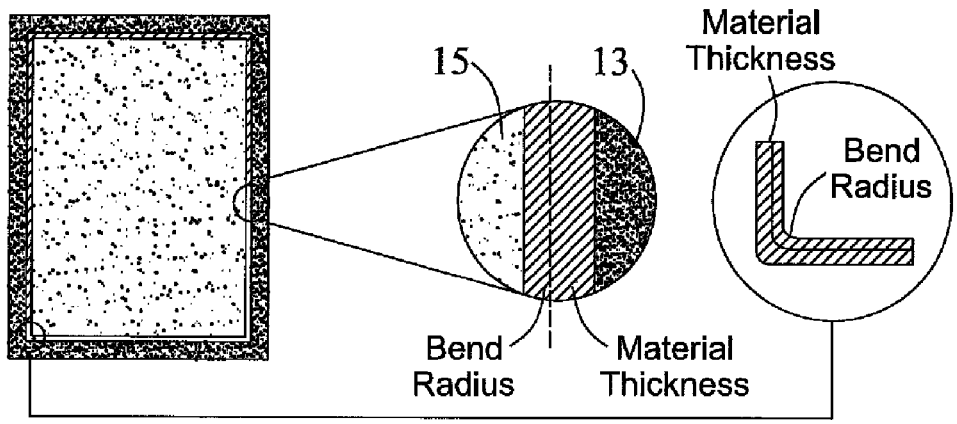
FIG. 17 illustrates how an exclusion zone is added to an enclosure.

The material currently used is 18 gage steel. The material thickness of this material is 0.048" and the bend radius is 0.075". Within this measurement (0.048"+0.075"=0.125") components (cutouts, studs, standoffs, etc) cannot be placed. Therefore, an EXCLUSION ZONE (red in color on the user's screen, shown as a darkened red area 13 in FIG. 17) in the FACE EDITOR. The light gray portion 15 of FIG. 17 is the area for the PCB, so while designing the enclosure the exclusion zone measurements need to added. Thus the dimension for the enclosure would be:

Height=1.06" (height of the PCB as discussed above)+0.125" (bottom surface of enclosure)+ 0.125" (top surface of enclosure)

Height=1.31"

Width=2.09" (the width of the PCB—see FIG. 14A)+ 0.125" (left surface of enclosure)+0.125" (right surface of enclosure)

Width=2.34"

Depth=3.1" (the depth of the PCB—see FIG. 14A)+ 0.125" (front surface of enclosure)+0.125" (rear surface of enclosure)

Depth=3.35"

Referencing Point for the Cutouts

Reference points are points along a given co-ordinate axis, from where the cutout or design with respect to the origin are referenced.

Figure 18:
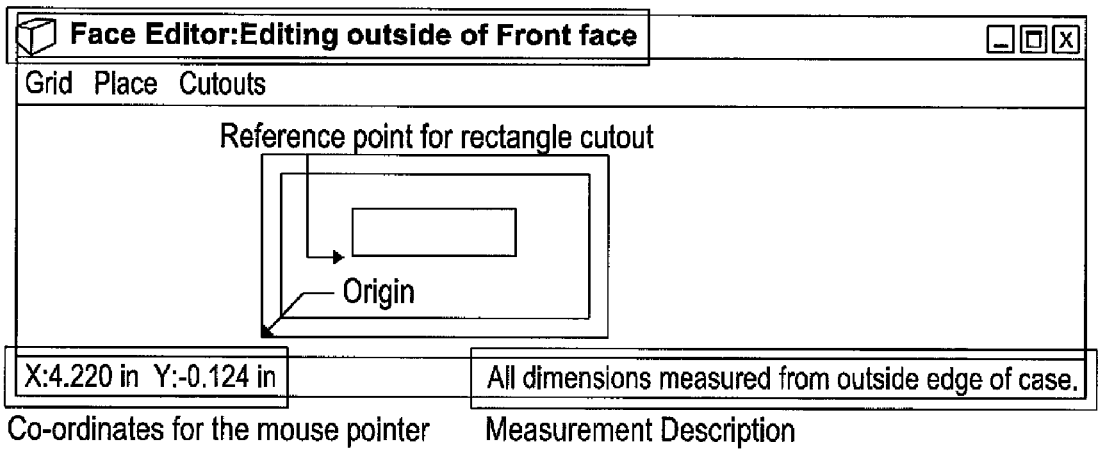
FIG. 18 illustrates a user screen used in the placement of a cutout reference point added to an enclosure.
Figure 19:
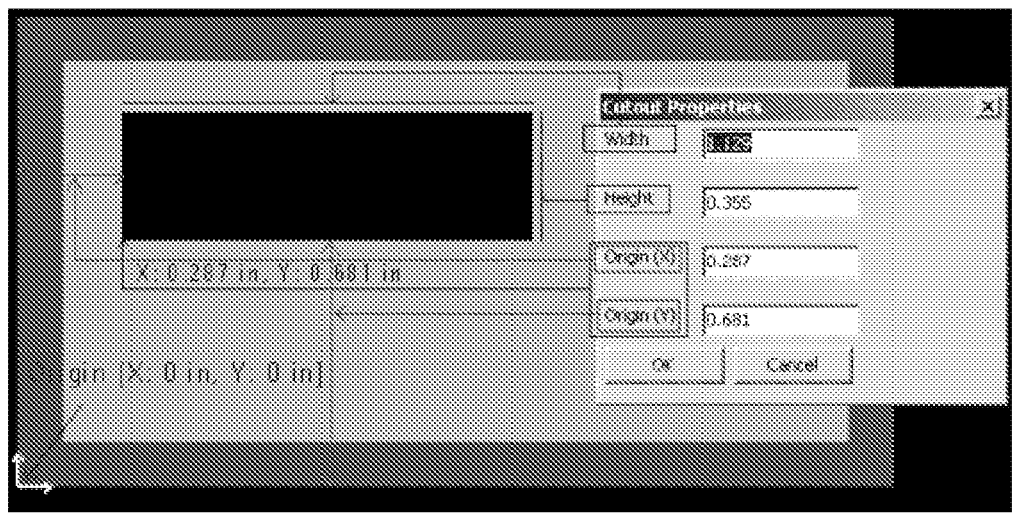
FIG. 19 illustrates the origin points and measurement properties of the rectangular cutout shown on the face editor.

With reference to FIG. 18, particularly the header portion 12, which is taken from one of the face editor examples, the bottom left rectangle shows the co-ordinate (X: 4.220 in, Y: −0.124 in) of the mouse pointer. The bottom right rectangle contains information about the measurement; whereas the top left rectangle describes the front face view. The origin of this face is the intersection of the two small horizontal and vertical lines; marked as 'Origin'. The reference point for the rectangle is also described. FIG. 19 illustrates the origin points and measurement properties of the rectangular cutout shown on the face editor.

Figure 20:
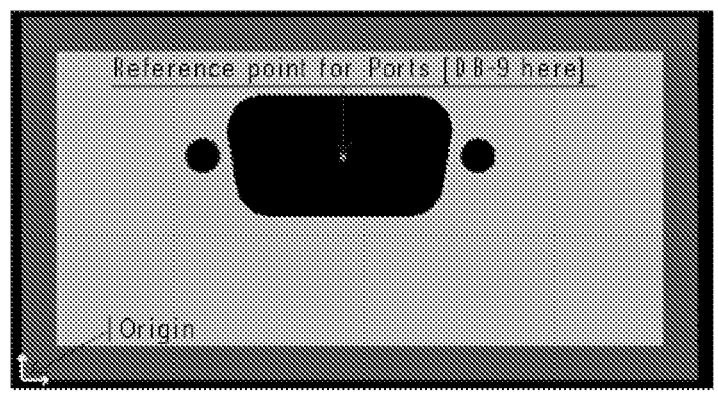
FIGS. 20 and 21 show an example of a reference point added for DB-9 cutout and circle, respectively.
Figure 21:
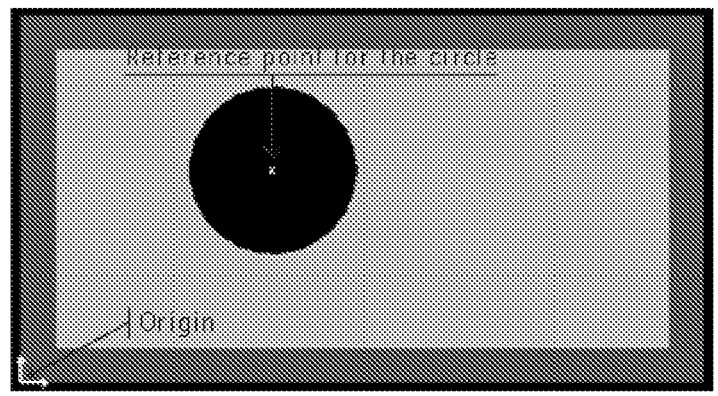

FIGS. 20 and 21 show the reference point for DB-9 and circle, respectively.

Once the required calculations and measurements have been done, the enclosure itself can be designed. The steps involved in designing the enclosure using the present method and system are as follows.

Figure 22:
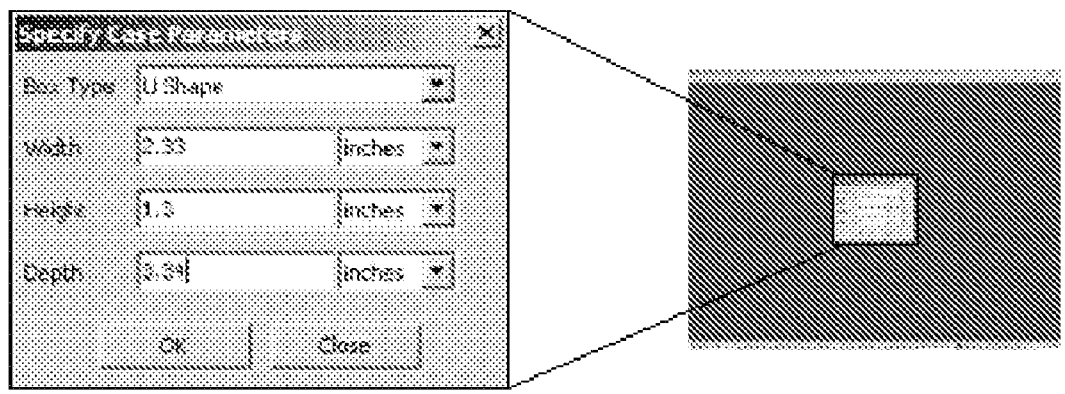
FIG. 22 illustrates selecting the width, height and depth parameters for a U-shape box in which a user designs to house a given PCB.

Specify the Dimension of the Board:

The values are inserted in the Parameter box 16 seen in FIG. 22. The width, height and depth is shown in FIGS. 14A and 15A. Calculation of dimensions is detailed above.

$W \times H \times D = 2.34" + 1.31" + 3.35"$

Figure 23:
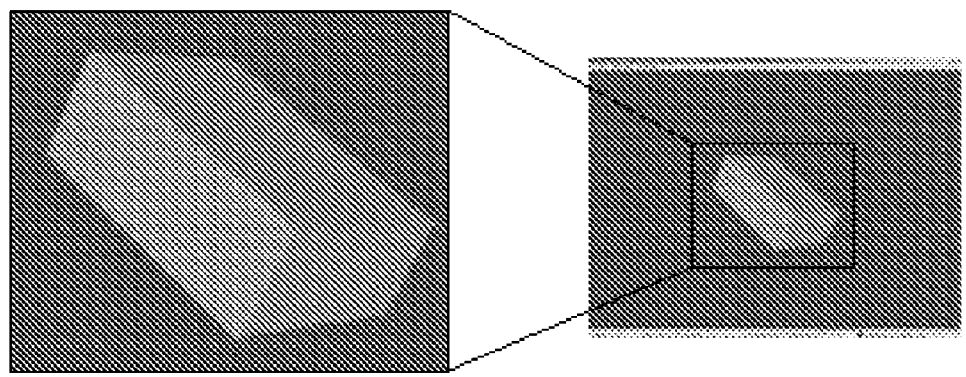
FIG. 23 illustrates an example of a customized enclosure designed using a method in accordance with the teachings of this invention in 3D.

At this stage, the enclosure can be viewed in 3D, as seen in FIG. 23.

Select a Face

Figure 24:
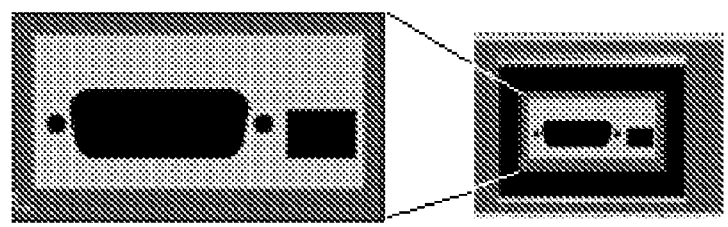
FIG. 24 illustrates how a DB-15 cutout can be added to a face of the enclosure to be designed in accordance with the example.

Now a face is selected to draw the DB-15 cutout and connector cutout. The DB-15 cutout can be found in Place→Port→DB15 (from software menu). The location of the DB-15 cutout and the connector cutout as shown in FIGS. 14A, 15A and 16A should be submitted. The user will get a screen as shown FIG. 24. It should be noted that a gap should be left for some gap for the clearance between the PCB and the enclosure.

Figure 25:
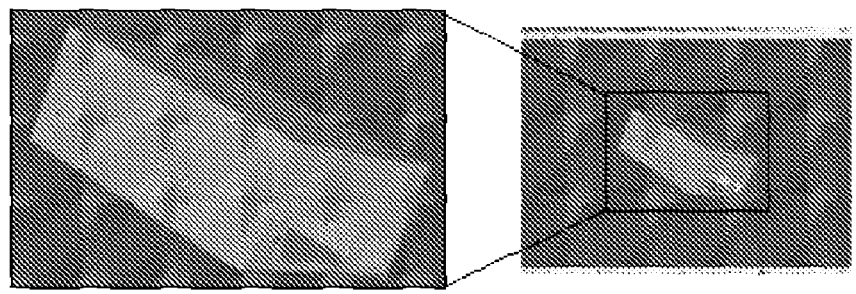
FIG. 25 illustrates the enclosure after the face of FIG. 24 has been added to the enclosure.

Upon closing this screen, the face will be applied to the enclosure, as seen in FIG. 25.

Add Cutouts

Figure 26:
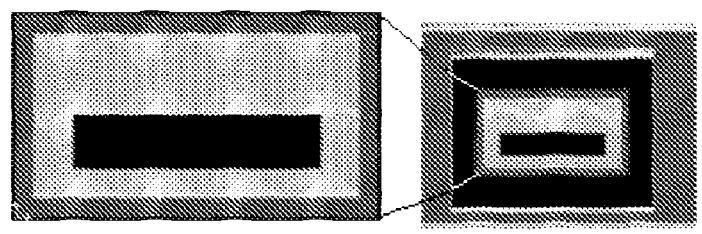
FIG. 26 illustrates how a rectangular cutout can be added to a face.

Cutouts can now be added for the connectors. Please refer to FIGS. 14A, 15A and 16A for the location and the dimensions of this cutout. Adding the cutout will result in a screen as shown in FIG. 26.

Figure 27:
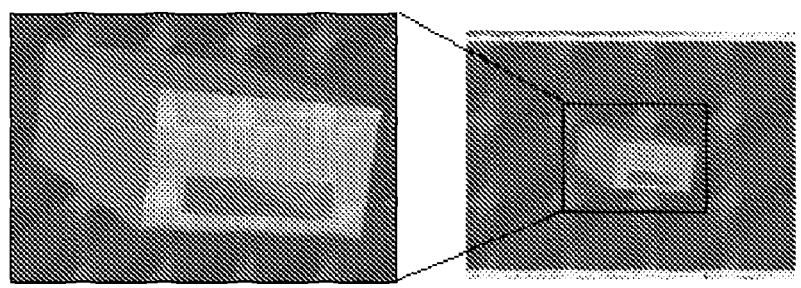
FIG. 27 illustrates the enclosure after the face of FIG. 26 has been added to the enclosure.

Upon closing this screen, the cutouts will be applied to the enclosure, as seen in FIG. 27.

Add Standoffs

Figure 28:
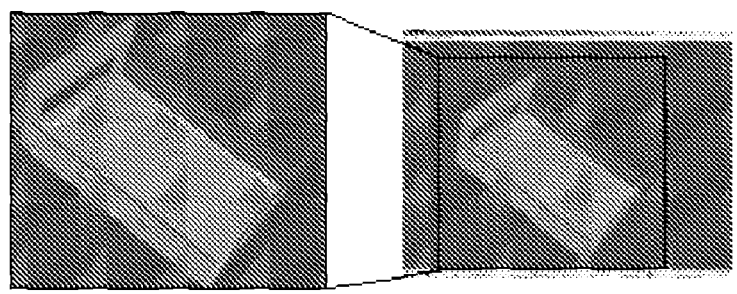
FIG. 28 illustrates a partial enclosure with the cover removed.

Standoffs can now be added. To do so, the user will first remove the cover by selecting View→Remove Cover on the toolbar. A screen as seen in FIG. 28 will appear.

Figure 29:
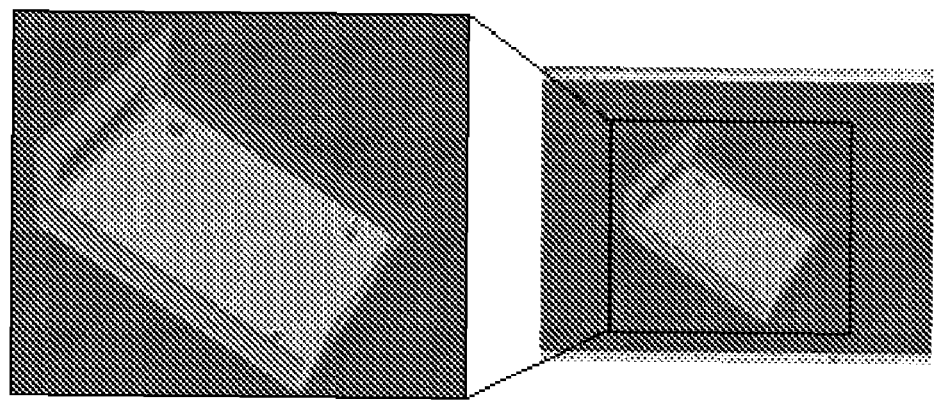
FIG. 29 illustrates a partial enclosure with the cover removed after standoffs have been added.

Now the user can select the bottom face and add 6-32¼" standoffs at the location shown in FIG. 14A. A screen as seen in FIG. 29 will appear.

View the Enclosure

Figure 30:
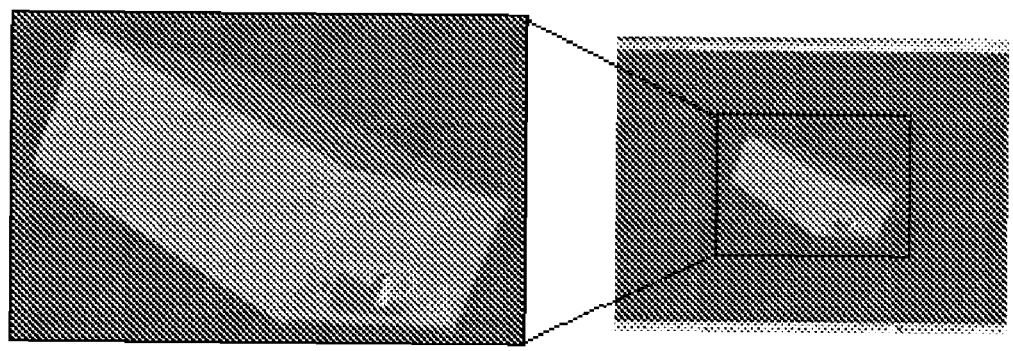
FIG. 30 illustrates the enclosure of FIG. 28 after the cover is replaced.

The cover can be put back by selecting View→Remove Cover from the toolbar. The drawing for the enclosure is now complete. The final screen should look as shown in FIG. 30.

Figure 31:
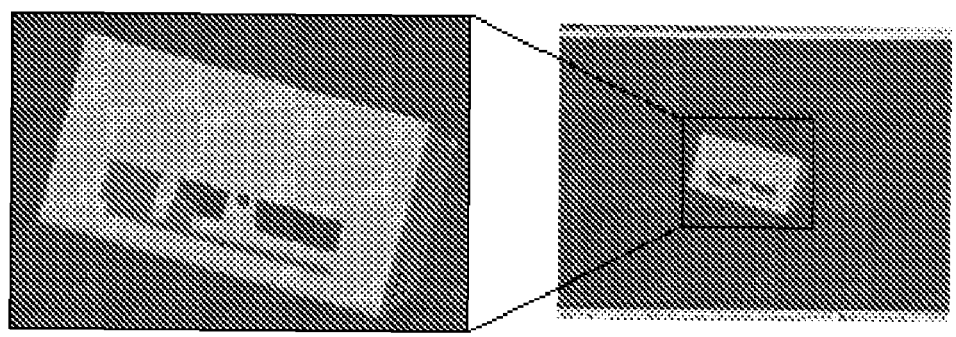
FIG. 31 illustrates a completed enclosure designed in accordance with the example.

The 3D enclosure can also be rotated, as shown in FIG. 31.

Estimate the Cost for the Enclosure

After the drawing is finished the price can be calculated by selecting Order→Estimate Price.

Place an Order

To place an order the user can select Order→Place Order and submit the requested customer and shipment information.

A client using the program can design a customized enclosure for various internal components including electronic components, such as PCBs without the need for creating a special CAD drawing. By providing a 3D template as a starting point, the design process in accordance with the teachings of this invention is relatively quick and easy. The availability of built in functions, such as cutout shape placement, further enhances the design process.

Numerous modifications may be made without departing from the spirit and scope of the invention as defined in the appended claims.

What is claimed is:

1. A computer-implemented method of creating specifications for fabrication of a customizable enclosure for housing electronic components, the method comprising:
   a) storing in a computer, a plurality of three dimensional templates representing possible basic forms of the customizable enclosure;
   b) storing in the computer a range of predefined design features for the customizable enclosure;
   c) displaying in a drop down box to a user, the stored plurality of three dimensional templates;
   d) selecting as a base shape, one of the displayed plurality of three dimensional templates or a template from an external software program, based on the size and shape of the electronic components to be housed;
   e) sizing the selected base shape by entering dimensions in a plurality of input boxes;
   f) selecting a face of the base shape;
   g) using a Face Editor stored on the computer to customize the customizable enclosure, the step of using the Face Editor comprising:
      i) selecting at least one design feature from the range of predetermined design features stored in the computer, the design features being selected from the group comprising cutouts, standoffs, ports and fasteners;
      ii) positioning the selected at least one design feature on the selected face; and
      iii) sizing the selected at least one design feature; and
   g) repeating steps f) and g) for each face of the base shape as necessary until a complete set of specifications for fabrication of the customizable enclosure for housing electronic components is created.

2. The method of claim 1, wherein the stored plurality of three dimensional templates include the shapes of a rackmount enclosure, a u-shaped enclosure, a mini-ITX enclosure and a mechanical mounting fixture.

3. The method of claim 1, further comprising a step of activating a grid on the template selected in step g).

4. The method of claim 3, wherein the grid comprises either lines or dots.

5. The method of claim 1, further comprising a step of viewing the customized enclosure in three dimensions.

6. The method of claim 1, further comprising a step of requesting a price estimate of the customized enclosure by a method selected from a group comprising of using embedded code, using a web query, or contacting a company representative.

7. The method of claim 6, further comprising a step of ordering the customized enclosure and filling in an online order processing form.

8. The method of claim 1, wherein the customizable enclosure is for housing a printed circuit board.

9. The method of claim 1, further comprising a step of applying silk-screening to at least one face of the customizable enclosure.

10. A computer-implemented system for creating specifications for fabrication of a customizable enclosure for housing electronic components, the system comprising:
   a) a storage medium for storing a plurality of three dimensional templates representing possible basic forms of the customizable enclosure and storing a range of predefined design features for the customizable enclosure;
   b) a drop down box for displaying the stored plurality of predetermined three dimensional templates;
   c) a processor for permitting a user to select as a base shape, one of the displayed three dimensional templates or a template from an external software program, based on the size and shape of the electronic components to be housed;
   d) a plurality of input boxes to permit a user to enter dimensions to size the selected base shape based on a user's requirements;
   e) a processor for permitting a user to select a face of the base shape;
   f) a Face Editor used to customize the selected face by:
      i) selecting design features from the stored range of predetermined design features based on the user's requirements, the design features being selected from the group comprising cutouts, standoffs, ports and fasteners;
      ii) positioning the selected design features on the selected face; and
      iii) sizing the selected design features;
   wherein the Face Editor can be used to customize each face of the base shape as necessary until a complete set of specifications for the enclosure is obtained.

11. A non-transitory computer-readable medium storing computer-executable code embodied therein which when executed on a computer performs a method for creating specifications for fabrication of a customizable enclosure for housing electronic components, the method comprising:
   a) storing in a computer, a plurality of three dimensional templates representing possible basic forms of the customizable enclosure and storing a range of predefined design features for the customizable enclosure;
   b) displaying in a drop down box, the stored plurality of predetermined three dimensional templates;
   c) selecting as a base shape, one of the displayed three dimensional templates or a template from an external software program, based on the size and shape of the electronic components to be housed;
   d) sizing the selected base shape based on a user's requirements by entering dimensions in a plurality of input boxes;
   e) selecting a face of the base shape;
   f) using a Face Editor to customize the selected face by:
      i) selecting design features from the range of stored predetermined design features based on the user's requirements, the design features being selected from the group comprising cutouts, standoffs, ports and fasteners;
      ii) positioning the selected design features on the selected face; and
      iii) sizing the selected design features; and
   g) repeating steps e), and f) for each face of the base shape as necessary until a complete set of specifications for the enclosure is obtained.

* * * * *